United States Patent
Kobayashi et al.

(10) Patent No.: US 7,872,402 B2
(45) Date of Patent: Jan. 18, 2011

(54) PEROVSKITE-OXIDE LAMINATES, AND PIEZOELECTRIC DEVICES, AND LIQUID DISCHARGE DEVICES CONTAINING THE SAME

(75) Inventors: Hiroyuki Kobayashi, Kanagawa-ken (JP); Yukio Sakashita, Kanagawa-ken (JP); Tsutomu Sasaki, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 124 days.

(21) Appl. No.: 12/243,701

(22) Filed: Oct. 1, 2008

(65) Prior Publication Data
US 2009/0085445 A1 Apr. 2, 2009

(30) Foreign Application Priority Data
Oct. 2, 2007 (JP) ............................. 2007-258464

(51) Int. Cl.
*H01L 41/187* (2006.01)
(52) U.S. Cl. ............ 310/358; 252/62.9 R; 252/62.9 PZ
(58) Field of Classification Search ................ 310/358; 252/62.9 PZ
See application file for complete search history.

(56) References Cited

U.S. PATENT DOCUMENTS

| 6,903,491 B2 * | 6/2005 | Irie et al. ..................... 310/328 |
| 7,298,018 B2 * | 11/2007 | Ezhilvalavan et al. ....... 257/532 |
| 7,312,514 B2 * | 12/2007 | Miyamoto et al. .......... 257/532 |
| 7,456,548 B2 * | 11/2008 | Kubota et al. ............... 310/324 |
| 7,479,728 B2 * | 1/2009 | Murai et al. ................. 310/363 |
| 7,525,239 B2 * | 4/2009 | Aoki et al. .................. 310/358 |
| 7,646,140 B2 * | 1/2010 | Aoki et al. .................. 310/358 |
| 2008/0074471 A1 * | 3/2008 | Sakashita et al. .............. 347/68 |

(Continued)

FOREIGN PATENT DOCUMENTS

| JP | 6-239696 A | 8/1994 |
| JP | 2001-302400 A | 10/2001 |

OTHER PUBLICATIONS

M. Okada et al., "Synthesis of Bi(Fe$_x$Al$_{1-x}$)O$_3$ Thin Films by Pulsed Laser Deposition and Its Structural Characterization", Japanese Journal of Applied Physics, vol. 43, No. 9B, pp. 6609-6612, 2004.

(Continued)

*Primary Examiner*—J. SanMartin
(74) *Attorney, Agent, or Firm*—Birch, Stewart, Kolasch & Birch, LLP.

(57) ABSTRACT

A perovskite-oxide lamination constituted by a substrate and one or tore first films of a first oxide of a perovskite type and one or more second films of a second oxide which are alternately formed over the substrate. The first oxide has a composition expressed as $ABO_3$, the second oxide has a composition expressed as $CDO_3$, each of A and C represents one or more A-site elements which are one or more metal elements, each of B and D represents one or more B-site elements which are one or more metal elements, O represents oxygen, and the second oxide is unable to be formed to have a perovskite crystal structure at normal pressure without a thickness limitation. The one or more first films and the one or more second films may contain inevitable impurities.

7 Claims, 3 Drawing Sheets

U.S. PATENT DOCUMENTS

2008/0089832 A1\* 4/2008 Aoki et al. ............... 423/608
2009/0020726 A1\* 1/2009 Uraki et al. ............. 252/62.9 R
2009/0230211 A1\* 9/2009 Kobayashi et al. ....... 239/102.2
2009/0267998 A1\* 10/2009 Sakashita et al. .............. 347/68

OTHER PUBLICATIONS

S. Yasui et al., "Formation of $BiFeO_3$-$BiScO_3$ Thin Films and Their Electrical Properties", Japanese Journal of Applied Physics, vol. 45, No. 9B, pp. 7321-7324, 2006.

\* cited by examiner

PEROVSKITE-OXIDE LAMINATES, AND PIEZOELECTRIC DEVICES, AND LIQUID DISCHARGE DEVICES CONTAINING THE SAME

BACKGROUND OF THE INVENTION

1. Field of the Invention

The present invention relates to a perovskite-oxide lamination, a piezoelectric device having the perovskite-oxide lamination, and a liquid discharge device using the piezoelectric device.

2. Description of the Related Art

Perovskite-type oxides are currently used in piezoelectric devices, switch devices, and the like since perovskite-type oxides exhibit ferroelectricity. For example, lead titanate zirconate (PZT) is known as a perovskite-type oxide exhibiting satisfactory piezoelectric characteristics. PZT is a ferroelectric material having spontaneous polarization even when no electric field is applied to PZT, and is reported to exhibit high piezoelectric performance at and near the morphotropic phase boundary (MPB).

However, currently, demands for higher piezoelectric performance and demands for lead-free piezoelectric materials (in consideration of the environmental load of the lead-containing materials) are increasing, and therefore development of new lead-free perovskite-oxide materials are proceeding.

In the process of the development of lead-free perovskite-type oxide materials, some perovskite-type oxides which are theoretically considered to exhibit high piezoelectric performance are known to be incapable of being formed to have a perovskite crystal structure by high-temperature baking at normal pressure, but to be capable of being formed to have a perovskite crystal structure by baking at high pressure exceeding several GPa (gigapascal). However, baking at high pressure requires complicated equipment and an uneasy process.

Some attempts to form, at normal pressure, a thin film of a material to have a perovskite crystal structure have been reported, although the material is unable to be formed to have a perovskite crystal structure unless being baked at high pressure.

M. Okada et al. (in "Synthesis of $Bi(Fe_xAl_{1-x})O_3$ Thin Films by Pulsed Laser Deposition and Its Structural Characterization", Japanese Journal of Applied Physics, Vol. 43, No. 9B, pp. 6609-6612, 2004) report that a thin film having a perovskite crystal structure can be formed by producing a solid solution of $BiAlO_3$ in $BiFeO_3$, where $BiAlO_3$ is unable to be formed to have a perovskite crystal structure unless being baked at high pressure although $BiFeO_3$ can be easily formed to have a perovskite crystal structure. However, in this case, the thin film formed as above has properties of a solid solution, and it is impossible to realize the characteristics unique to $BiAlO_3$.

In addition, S. Yasui et al. (in "Formation of $BiFeO_3$—$BiScO_3$ Thin Films and Their Electrical Properties", Japanese Journal of Applied Physics, Vol. 45, No. 9B, pp. 7321-7324, 2006) report that a thin film having a perovskite crystal structure can be formed by producing a solid solution of $BiScO_3$ in $BiFeO_3$, where $BiScO_3$ is unable to be formed to have a perovskite crystal structure unless being baked at high pressure.

Japanese Unexamined Patent Publication No. 6(1994)-239696 (hereinafter referred to as JP6-239696A) discloses a process for realizing a perovskite crystal structure by utilizing the stress produced by lattice matching with an underlying layer, as a technique for forming a thin film having a perovskite crystal structure without solid solution. Specifically, JP6-239696A discloses that a perovskite crystal structure can be realized by epitaxial growth of a high-temperature superconductivity thin film having an infinite-layer structure (which have been able to be formed only by the high-pressure synthesis) on an underlying layer of a perovskite-type oxide having the composition expressed as $A_2BO_4$, where a thin-film deposition technique such as sputtering or evaporation is used for formation of the high-temperature superconductivity thin film.

Nevertheless, the perovskite-type oxide disclosed in JP6-239696A has the composition expressed as $A_2BO_4$, and JP6-239696A does not teach the general applicability of the disclosed technique to the simple perovskite crystal structure. In addition, since the stress caused by the lattice matching with the underlying layer is relaxed in the case where the thickness of the thin film exceeds a predetermined value, there is a possibility that the thin film can become unable to be formed to have a perovskite crystal structure when the film thickness increases. That is, the thickness of the thin film which can be formed to have a perovskite crystal structure is limited.

SUMMARY OF THE INVENTION

The present invention has been made in view of the above circumstances.

The first object of the present invention is to provide a perovskite-oxide lamination which can be produced at normal pressure without a thickness limitation, and can exhibit characteristics of a perovskite crystal structure of an oxide which cannot be realized by formation under the normal condition without a thickness limitation.

The second object of the present invention is to provide a piezoelectric device using a perovskite oxide which is theoretically considered to be able to exhibit high piezoelectric performance and cannot be formed to have a perovskite crystal structure at normal pressure without a thickness limitation, where the perovskite crystal structure of the perovskite oxide is formed in the perovskite-oxide lamination which achieves the first object.

The third object of the present invention is to provide a liquid discharge device using the piezoelectric device which achieves the second object.

In this specification, the expression "normal pressure" means the atmospheric pressure and the pressure in the range within which thin films are normally formed by conventional film-formation techniques. The techniques of forming a thin film of a piezoelectric material can be roughly classified into the vapor phase techniques and the liquid phase techniques. The vapor phase techniques include sputtering, pulsed-laser deposition (PLD), and chemical vapor deposition (CVD). The liquid phase techniques include the sol-gel technique. The range of pressures commonly used in the vapor phase techniques is approximately $10^{-4}$ to $10^3$ Pa ($7.6 \times 10^{-4}$ mTorr to $6 \times 10^3$ mTorr), and the pressure commonly used in the liquid phase techniques is the atmospheric pressure (approximately $10^5$ Pa (760 Torr)).

(I) In order to accomplish the first object, according to the first aspect of the present invention, a perovskite-oxide lamination is provided. The perovskite-oxide lamination comprises a substrate and one or more first films of a first oxide of a perovskite type and one or more second films of a second oxide which are alternately formed over the substrate. The first oxide has a composition expressed as $ABO_3$, the second oxide has a composition expressed as $CDO_3$, each of A and C represents one or more A-site elements which are one or more metal elements, each of B and D represents one or more B-site elements which are one or more metal elements, O represents oxygen, and the second oxide is unable to be formed to have a perovskite crystal structure at normal pressure without a thickness limitation. The one or more first films and the one or more second films may contain inevitable impurities.

Although the ratio of each of the molar amount of the atoms of the A-site element and the total molar amount of the atoms of the B-site elements to the molar amount of the oxygen atoms in each of the first and second perovskite-type oxides is normally 1:3, the ratio may deviate from 1:3 within a range in which a perovskite crystal structure can be formed.

In this specification, the oxides which are "unable to be formed to have a perovskite crystal structure at normal pressure without a thickness limitation" include the following oxides (1) to (3).

(1) The oxides which cannot be formed to have a perovskite crystal structure by sintering using solid phase reaction at a pressure near the atmospheric pressure when the oxides are formed as a bulk ceramic.

(2) The oxides which cannot be formed to have a perovskite crystal structure when a thin film of each of the oxides is formed on an amorphous substrate. In this case, the amorphous substrate is, for example, a quartz substrate or a silicon substrate on which a thermally oxidized film is formed.

(3) The oxides which cannot be epitaxially grown when a thin film of each of the oxides is formed on a monocrystalline substrate. For example, in the case where a film of $BiXO_3$ is formed on a (001) face of a substrate so that the (001) face of $BiXO_3$ lattice matches with the (001) face of the substrate, and a condition for not causing epitaxial growth is satisfied, the film does not have a perovskite crystal structure. In this case, the condition for not causing epitaxial growth is that the value of nCs/mC does not fall within the range of 0.95 to 1.05, where Cs is the lattice constant of the substrate, C is the lattice constant of $BiXO_3$ and each of n and m is 1 to 5.

In the perovskite-oxide lamination according to the first aspect of the present invention, the one or more first films of the first oxide of the perovskite type and the one or more second films of the second oxide are alternately formed over the substrate, and each of the one or more second films can be formed to have a perovskite crystal structure, by utilizing the stress produced by lattice matching with a layer underlying the second film. Therefore, the layer underlying each second film must have a perovskite crystal structure, where the layer underlying each second film may be the substrate or one of the one or more first films.

Preferably, the perovskite-oxide lamination according to the first aspect of the present invention may further have one or any possible combination of the following additional features (i) to (iv).

(i) The one or more A-site elements represented by C is preferably Bi.

(ii) The one or more B site elements represented by D is preferably one or more of the metal elements Al, Sc, Ga.

(iii) The one or more first films and the one or more second films are preferably epitaxial films.

(iv) The substrate is preferably a monocrystalline substrate of silicon or an oxide.

(II) In order to accomplish the second object, according to the second aspect of the present invention, a piezoelectric device is provided. The piezoelectric device comprises the perovskite-oxide lamination according to the first aspect of the present invention, and electrodes formed integrally with the perovskite-oxide lamination.

(III) In order to accomplish the third object, according to the third aspect of the present invention, a liquid discharge device is provided. The liquid discharge device comprises the piezoelectric device according to the second aspect of the present invention; and a discharge member which is formed integrally with or separately from the substrate in the piezoelectric device. The discharge member includes a liquid-reserve chamber which reserves liquid, and a liquid-discharge outlet through which the liquid is externally discharged from the liquid-reserve chamber.

(IV) Japanese Unexamined Patent Publication No. 2001-302400 (which is hereinafter referred to as JP2001-302400A) discloses an oxide superlattice in which thin films of two or more types of perovskite oxides are repeatedly laminated, and reports that the lamination of the thin films adjusts the distortion of the lattice, and improves the characteristics. That is, the lamination in which thin films of two or more types of perovskite oxides are laminated is conventionally known. However, all of the two or more types of perovskite oxides in the lamination disclosed in JP2001-302400A are oxides which can be easily formed to have a perovskite crystal structure by baking of the oxide in bulk at normal pressure or formation of a film of the oxide on an amorphous substrate, and JP2001-302400A discloses that the object of the lamination is improvement of the characteristics.

On the other hand, the perovskite-oxide lamination according to the present invention is different from the lamination disclosed in JP2001-302400A in that the second oxide is unable to be formed to have a perovskite crystal structure at normal pressure without a thickness limitation. In addition, the object of the present invention to easily form the above second oxide to have a perovskite crystal structure without a thickness limitation by production at normal pressure. JP2001-302400A does not suggest the object of the present invention.

(V) The advantages of the present invention are explained below.

In the perovskite-oxide lamination according to the first aspect of the present invention, the one or more first films of the first oxide of a perovskite type and the one or more second films of the second oxide are alternately formed over the substrate, and the second oxide is unable to be formed to have a perovskite crystal structure without a thickness limitation at normal pressure. In the process of forming the perovskite-oxide lamination according to the first aspect of the present invention, each of the second films is formed by utilizing the stress caused by the lattice matching with a layer underlying the second film. Therefore, the perovskite-oxide lamination according to the first aspect of the present invention can be easily produced at normal pressure.

In addition, it is possible to control the thickness of each second film so that the stress imposed from the underlying layer does not become too small, and increase the number of the second films until the total thickness of the one or more second films reaches a desired value. Therefore, the total thickness of the one or more second films is not limited.

Further, the first and second films are each an independent oxide film, and are not a solid solution, so that the first and second films can exhibit their intrinsic characteristics, instead of the characteristic of a solid solution. For example, it is possible to intensify the characteristics of the second oxide by making the total thickness of the second films greater than the total thickness of the one or more first films.

Thus, the perovskite-oxide lamination according to the first aspect of the present invention can exhibit the characteristics of a perovskite crystal structure of the second oxide which is unable to be formed to have a perovskite crystal structure without a thickness limitation at normal pressure. In addition, the perovskite-oxide lamination can be produced at normal pressure without a thickness limitation.

Further, in the case where the second (perovskite) oxide is theoretically considered to be able to exhibit high piezoelectric performance, the perovskite-oxide lamination according to the first aspect of the present invention can be effectively used in a piezoelectric device. Therefore, in this case, the piezoelectric device according to the second aspect of the present invention can be expected to exhibit high piezoelectric performance.

DETAILED DESCRIPTION OF THE INVENTION

Preferred embodiments of the present invention are explained in detail below with reference to drawings.

1. Perovskite-Oxide Lamination 1.1 Structure of Perovskite-Oxide Lamination

Figure 1:
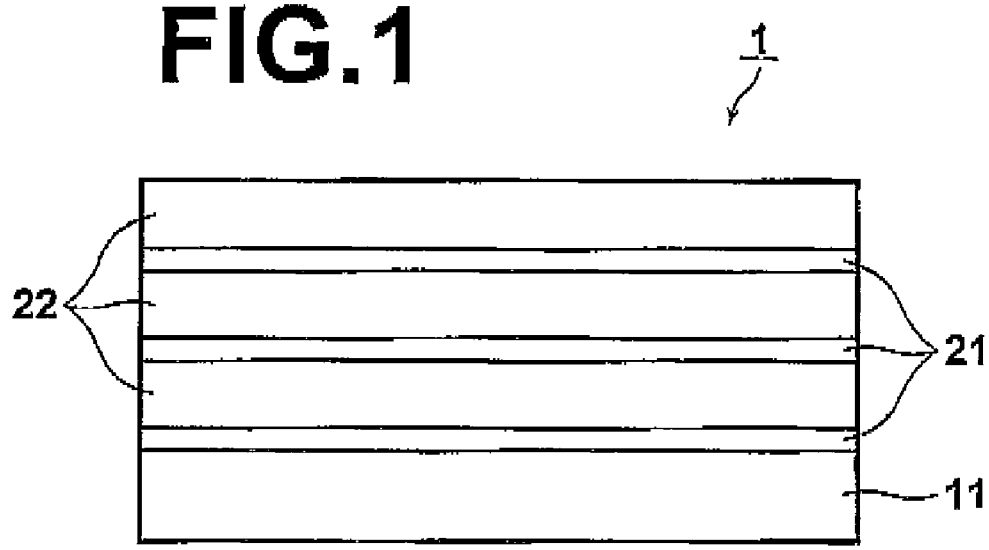
FIG. 1 is a cross-sectional view schematically illustrating a cross section, along a thickness direction, of a perovskite-oxide lamination according to an embodiment of the present invention.

The perovskite-oxide lamination according to a preferred embodiment of the present invention is explained below. FIG. 1 is a cross-sectional view schematically illustrating a cross section, along the thickness direction, of the perovskite-oxide lamination according to an embodiment.

As illustrated in FIG. 1, the perovskite-oxide lamination 1 is constituted by a substrate 11, one or more first films 21, and one or more second films 22. The one or more first films 21 and the one or more second films 22 are alternately formed over the substrate 11. The one or more first films 21 are formed of a first oxide of a perovskite type, and the one or more second films 22 are formed of a second oxide. In the example of FIG. 1, the lowermost one of the one or more first films 21 is directly formed on the substrate 11. The one or more first films 21 and the one or more second films 22 may contain inevitable impurities.

The first oxide is an oxide which can be easily formed to have a perovskite crystal structure at normal pressure (for example, by baking of the first oxide in bulk at normal pressure or formation of a film of the first oxide directly on an amorphous substrate). On the other hand, the second oxide is an oxide which cannot be formed to have a perovskite crystal structure without a thickness limitation at normal pressure (for example, by baking of the second oxide in bulk at normal pressure or formation of a film of the second oxide directly on an amorphous substrate). However, in the perovskite-oxide lamination 1 according to the present embodiment, each of the one or more second films 22 is formed to have a perovskite crystal structure at normal pressure on an underlying layer having a perovskite crystal structure (which is the substrate 11 or one of the one or more first films 21) by utilizing the stress due to lattice matching with the underlying layer.

If a film of the second oxide is formed directly on an amorphous substrate, the second oxide cannot be easily formed to have a perovskite crystal structure since the stress due to the lattice matching with the underlying layer does not occur. On the other hand, when a film of the second oxide is formed on an underlying layer having a perovskite e crystal structure, the film of the second oxide has a perovskite crystal structure because of the stress due to the lattice matching with the underlying layer. Therefore, the layer underlying each of the one or more second films 22 (which is the substrate 11 or one of the one or more first films 21) must have a perovskite crystal structure.

In the case where each of the one or more second films 22 is formed on one of the one or more first films 21, it is possible to form one or more other layers (e.g., an electrode and/or a buffer layer) between the substrate 11 and the lowermost one of the one or more first films 21. In addition, it is also possible to form one or more other layers (e.g., a metal electrode) on the uppermost film in the lamination of the one or more first films 21 and the one or more second films 22. Further, in the case where an electrode or a buffer layer formed between the substrate 11 and the lowermost film in the lamination of the one or more first films 21 and the one or more second films 22 has a perovskite crystal structure, the electrode or the buffer layer can play the role of the layer underlying the lowermost one of the one or more second films 22. In other words, in the case where the electrode or the buffer layer formed between the substrate 11 and the lowermost film in the above lamination has a perovskite crystal structure, the lowermost one of the one or more second films 22 may be an electrode or a buffer layer.

The one or more second films 22 are preferably an oriented crystalline film or an epitaxial film, since a perovskite crystal structure can be stably formed in the one or more second films 22 in this case.

In the case where the one or more second films 22 are each an epitaxial film, it is necessary that the layer underlying each of the one or more second films 22 be an epitaxial film or a monocrystalline substrate. In the case where the substrate 11 is a monocrystalline substrate having a perovskite crystal structure, the lowermost one of the one or more second films 22 may be formed directly on the substrate 11 or through the lowermost one of the one or more first films 21 over the substrate 11. It is preferable that adjacent ones of the films constituting the perovskite-oxide lamination 1 lattice match well with each other. Therefore, it is preferable that the one or more first films 21 and the one or more second films 22 be layered in the order determined in consideration of the lattice matching between adjacent films. An example of a monocrystalline substrate having a perovskite crystal structure is the monocrystalline substrate of an oxide such as $SrTiO_3$.

In the case where the substrate 11 does not have a perovskite crystal structure, the lowermost one of the one or more second films 22 is formed through the lowermost one of the one or more first films 21 over the substrate 11. Since, at this time, it is preferable that the lowermost one of the one or more first films 21 be also an epitaxial film, it is preferable that the substrate 11 be a monocrystalline substrate, for example, a monocrystalline substrate of silicon.

In any case, it is preferable that each film (layer) formed over the substrate 11 be made of a material which lattice matches with the underlying film (layer), and be an epitaxial film.

The material of the one or more first films 21 (i.e., the first oxide) is not specifically limited as long as the material has the composition $ABO_3$ and a perovskite crystal structure, where A represents one or more A-site elements which are one or more metal elements, B represents one or more B-site elements which are one or more metal elements, and O represents oxygen. In addition, the material preferable for the one or more first films 21 can be chosen according to the use of the perovskite-oxide lamination 1. For example, in the case where the perovskite-oxide lamination 1 is to be used as a piezoelectric body, a material superior in the piezoelectric performance is preferable for the one or more first films 21. Specifically, the material preferable for the one or more first films 21 may be one of the lead-containing compounds (1) and the nonlead compounds (2) indicated below, or a mixed crystal of two or more of the lead-containing compounds (1) and the nonlead compounds (2).

(1) Lead-containing compounds such as lead titanate, lead titanate zirconate (PZT), lead zirconate, lead lanthanum titanate, lead lanthanum titanate zirconate, lead magnesium niobate-lead zirconium titanate, lead nickel niobate-lead zirconium titanate, lead zinc niobate-lead zirconium titanate, and the like.

(2) Nonlead compounds such as barium titanate, barium strontium titanate, bismuth sodium titanate, bismuth potassium titanate, sodium niobate, potassium niobate, lithium niobate, bismuth ferrite ($BiFeO_3$), and the like.

The material of the one or more second films 22 (i.e., the second oxide) is an oxide which has the composition $CDO_3$ (where C represents one or more A-site elements which are one or more metal elements, D represents one or more B-site elements which are one or more metal elements, and O represents oxygen), and cannot be formed to have a perovskite crystal structure at normal pressure (for example, by baking of the oxide in bulk at normal pressure or formation of a film of the oxide directly on an amorphous substrate), although the oxide can be formed into a thin film having a perovskite crystal structure under a special condition (for example, by baking of the oxide in bulk at high pressure or formation of a film of the oxide on an monocrystalline substrate). The one or more A-site elements C and the one or more B-site elements D are not specifically limited, and can be chosen according to the use of the one or more second films 22 as well as the one or more first films 21.

Japanese Patent Application No. 2007-010185 (which is filed by the assignee of the present application and is hereinafter referred to as JP2007-010185) discloses a perovskite oxide exhibiting satisfactory piezoelectric performance and a process for producing the perovskite oxide on the basis of a novel material-design technique for designing a perovskite oxide exhibiting satisfactory piezoelectric performance. JP2007-010185 reports that a lead-free perovskite oxide exhibiting satisfactory piezoelectric performance can be obtained when the lead-free perovskite oxide contains bismuth (Bi) as the main component of the A-site elements. In addition, JP2007-010185 reports that the lead-free perovskite oxide preferably contains one or more of the elements Al, Sc, Ga, In, and Y as the B-site element. However, there is a tendency that the perovskite oxide cannot be easily formed to have a perovskite crystal structure by the normal production processes in the case where the B-site element are one or more of the elements Al, Sc, and Ga, although the tendency depends on the composition of the perovskite oxide. That is, even when an oxide is expected to exhibit very high piezoelectric performance from the viewpoint of material design, there is a possibility that the oxide cannot be easily formed to have a perovskite crystal structure under a normal condition, or the composition or the like of such an oxide is limited.

Nevertheless, in the case where Bi is the A-site element C and one or more of the elements Al, Sc, and Ga are the B-site elements D in the one or more second films 22 having the composition $CDO_3$ in the perovskite-oxide lamination 1 according to the present embodiment, it is possible to easily form at normal pressure a lead-free perovskite oxide having the composition $CDO_3$ and exhibiting high piezoelectric performance.

Although it is sufficient that the perovskite-oxide lamination 1 contain at least one first film 21 and at least one second film 22, the numbers of the one or more first films 21 and the one or more second films 22 are appropriately determined according to the necessary thickness. For example, when the perovskite-oxide lamination 1 is to be used as a piezoelectric body, it is preferable that the thickness of the perovskite-oxide lamination 1 be approximately 100 nanometers to several micrometers.

The thickness of each of the one or more first films 21 is not specifically limited, and may be small as long as the first film 21 can impose sufficient stress on one of the one or more second films 22 formed on the first film 21, where the stress is caused by lattice matching of the second film 22 with the first film 21.

The thickness of each of the one or more second films 22 is not specifically limited as long as the stress which is caused by lattice matching of the second film 22 with a layer (the substrate 11 or one of the one or more first films 21) underlying the second film 22 and imposed on the second film 22 is exerted on the full thickness of the second film 22 (although the stress is reduced with increase in the thickness of the second film 22). The thickness of each of the one or more second films 22 at which the stress caused by the lattice matching becomes unable to be exerted on the full thickness of the second film 22 differs depending on the materials of the second film 22 and the underlying layer.

As mentioned before, the one or more first films 21 may be formed of bismuth ferrite ($BiFeO_3$). However, it is known that although bismuth ferrite exhibits satisfactory piezoelectric performance, the insulation characteristics of bismuth ferrite are poor, so that leakage current is likely to occur. Therefore, conventionally, a measure to suppress the leakage current (e.g., use of an additive agent such as Mn) has been required to be taken. Even when only the measurement of the characteristics is performed, it is necessary to take a measure, for example, by performing the measurement at low temperature (e.g., at approximately −150° C.).

Nevertheless, in the perovskite-oxide lamination 1 according to the present embodiment, the one or more first films 21 and the one or more second films 22 are alternately formed. Therefore, even in the case where the one or more second films 22 are formed of bismuth ferrite (which exhibits poor insulation characteristics), it is possible to form the one or more second films 22 of a material exhibiting satisfactory insulation characteristics, and sandwich each of the one or more first films 21 by the second films 22 and/or the substrate 11, so that suppression of the leakage current from bismuth ferrite and improvement of the insulation characteristics can be expected.

1.2 Advantages of Perovskite-Oxide Lamination

In the perovskite-oxide lamination 1 according to the present embodiment, the one or more first films 21 of the first oxide of a perovskite type and the one or more second films 22 of the second oxide are alternately formed over the substrate 11, and the second oxide is unable to be formed to have a perovskite crystal structure without a thickness limitation at normal pressure. In the process of forming the perovskite-oxide lamination 1 according to the present embodiment, each of the second films 22 is formed by utilizing the stress caused by the lattice matching with a layer underlying the second film. Therefore, the perovskite-oxide lamination 1 according to the present embodiment can be easily produced even at normal pressure.

In addition, it is possible to control the thickness of each second film so that the stress imposed from the underlying layer does not become too small, and increase the number of the one or more second films 22 until the total thickness of the one or more second films 22 reaches a desired value. Therefore, the total thickness of the one or more second films 22 is not limited.

Further, the first and second films 21 and 22 are each an independent oxide film, and are not a solid solution, so that the first and second films 21 and 22 can exhibit their intrinsic characteristics, instead of the characteristic of a solid solution. For example, it is possible to intensify the characteristics of the second oxide by making the total thickness of the second films 22 greater than the total thickness of the one or more first films 21.

Thus, the perovskite-oxide lamination 1 according to the present embodiment can exhibit the characteristics of a perovskite crystal structure of the second oxide, which is unable to be formed to have a perovskite crystal structure without a thickness limitation at normal pressure. In addition, the perovskite-oxide lamination 1 can be produced at normal pressure without a thickness limitation.

2. Piezoelectric Device and Inkjet Recording Head

Figure 2:
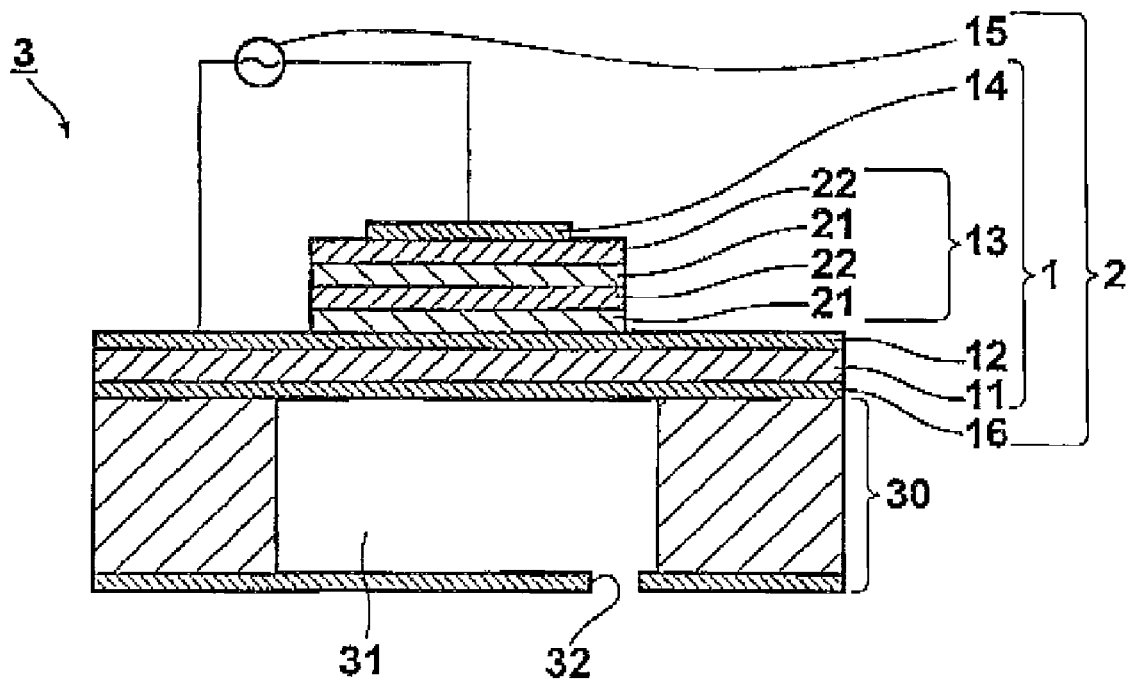
FIG. 2 is a cross-sectional view schematically illustrating a cross section of an essential portion of an inkjet recording head (as a liquid discharge device) having a piezoelectric device according to an embodiment of the present invention.

Hereinbelow, the structure of an inkjet recording head (as an embodiment of the liquid discharge device according to the third aspect of the present invention) containing a piezoelectric device (as an embodiment of the piezoelectric device according to the second aspect of the present invention) is explained with reference to FIG. 2, which is a cross-sectional view schematically illustrating a cross section (along the thickness direction) of an essential portion of the inkjet recording head. In FIG. 2, the dimensions of the illustrated elements are differentiated from the dimensions of the elements of the actual inkjet recording head for clarification.

In outline, the inkjet recording head 3 illustrated in FIG. 2 is constituted by a piezoelectric actuator 2 and an ink nozzle 30, and the piezoelectric actuator 2 is constituted by a piezoelectric device 1 and a diaphragm 16.

In the preferable example, the piezoelectric device 1 is realized by the perovskite-oxide lamination 1 having electrodes formed together with the one or more first films 21 and the one or more second films 22 as explained before. The piezoelectric device 1 is produced by forming on a substrate 11 a lower electrode 12, a piezoelectric film 13, and an upper electrode 14 in this order so that the substrate 11, the lower electrode 12, the piezoelectric film 13, and the upper electrode 14 formed together realize the perovskite-oxide lamination 1. An electric field along the thickness direction can be applied to the piezoelectric film 13 through the lower electrode 12 and the upper electrode 14.

The piezoelectric actuator 2 is produced by attaching the diaphragm 16 to the back surface of the substrate 11 of the piezoelectric device 1 so that the diaphragm 16 can vibrate in correspondence with expansion and contraction of the piezoelectric film 13. In addition, the piezoelectric actuator 2 comprises a control means 15 (such as a driver circuit) for driving the piezoelectric device 1.

The inkjet recording head 3 is produced by attaching the ink nozzle 30 to the back surface of the piezoelectric actuator 2. The ink nozzle 30 is a member for reserving and discharging ink, and comprises an ink chamber 31 (as the liquid-reserve chamber) and an ink-discharge outlet 32 (as the liquid-discharge outlet). The ink chamber 31 reserves the ink, and the ink held in the ink chamber is discharged out of the ink chamber through the corresponding ink-discharge outlet.

In the above inkjet recording head 3, the strength of the electric field applied to the piezoelectric device 1 is increased or decreased so as to expand or contract the piezoelectric device 1 and control the discharge of the ink from the ink chamber 31 and the discharge amount of the ink.

Alternatively, it is possible to process portions of the substrate 11 into the diaphragm 16 and the ink nozzle 30, instead of separately preparing the diaphragm 16 and the ink nozzle 30 and attaching the diaphragm 16 and the ink nozzle 30 to the piezoelectric device 1. For example, the ink chamber 31 can be formed by etching a corresponding portion of the substrate 11 from the bottom surface of the substrate 11, and the diaphragm 16 and the structures of the ink nozzle 30 can be produced by machining or processing the substrate 11 per se.

Since the piezoelectric device 1 in FIG. 2 corresponds to the aforementioned perovskite-oxide lamination 1, the substrate 11 in the piezoelectric device 1 is preferably made of the material explained before with reference to FIG. 1.

The main component of the lower electrode 12 is not specifically limited, and may be, for example, one or a combination of metals such as Au, Pt, and Ir and metal oxides such as $IrO_2$, $RuO_2$, $LaNiO_3$, and $SrRuO_3$. In addition, it is possible to form a buffer layer or the like between the substrate 11 and the lower electrode 12.

Generally, the piezoelectric film 13 has a perovskite crystal structure, which may be a simple perovskite structure, a complex perovskite structure, or a layered perovskite structure. However, preferably, the piezoelectric film 13 has a simple perovskite structure or a complex perovskite structure. In the preferable example illustrated in FIG. 2, the piezoelectric film 13 is realized by the lamination of the one or more first films 21 and the one or more second films 22 in the perovskite-oxide lamination 1 as explained before.

In the case where the lower electrode 12 is formed of a perovskite-type oxide such as $LaNiO_3$ or $SrRuO_3$, the lower electrode 12 can play the role of the lowermost one of the one or more first films 21, so that the lowermost film constituting the piezoelectric film 13 may be the lowermost one of the one or more second films 22.

The main component of the upper electrode 14 is not specifically limited, and may be, for example, one or a combination of the materials mentioned before for the lower electrode 12 and the materials (such as Al, Ta, Cr, and Cu) which are generally used for electrodes in the semiconductor processes.

Although the thicknesses of the lower electrode 12 and the upper electrodes 14 are not specifically limited, it is preferable that the thicknesses of the lower electrode 12 and the upper electrodes 14 be 50 to 500 nm.

As mentioned before, in the preferable example, the piezoelectric device 1 is realized by the perovskite-oxide lamination 1 explained before. In the perovskite-oxide lamination 1, one or more films of an oxide which is theoretically considered to be able to exhibit high piezoelectric performance and is unable to be formed to have a perovskite crystal structure without a thickness limitation at normal pressure are formed to have a perovskite crystal structure at normal pressure, and the total thickness of the one or more films is not limited. Therefore, according to the present embodiment, it is possible to provide a piezoelectric device 1 and the inkjet recording head (liquid discharge device) 3 which use such an oxide.

3. Inkjet Recording Apparatus

Figure 3:
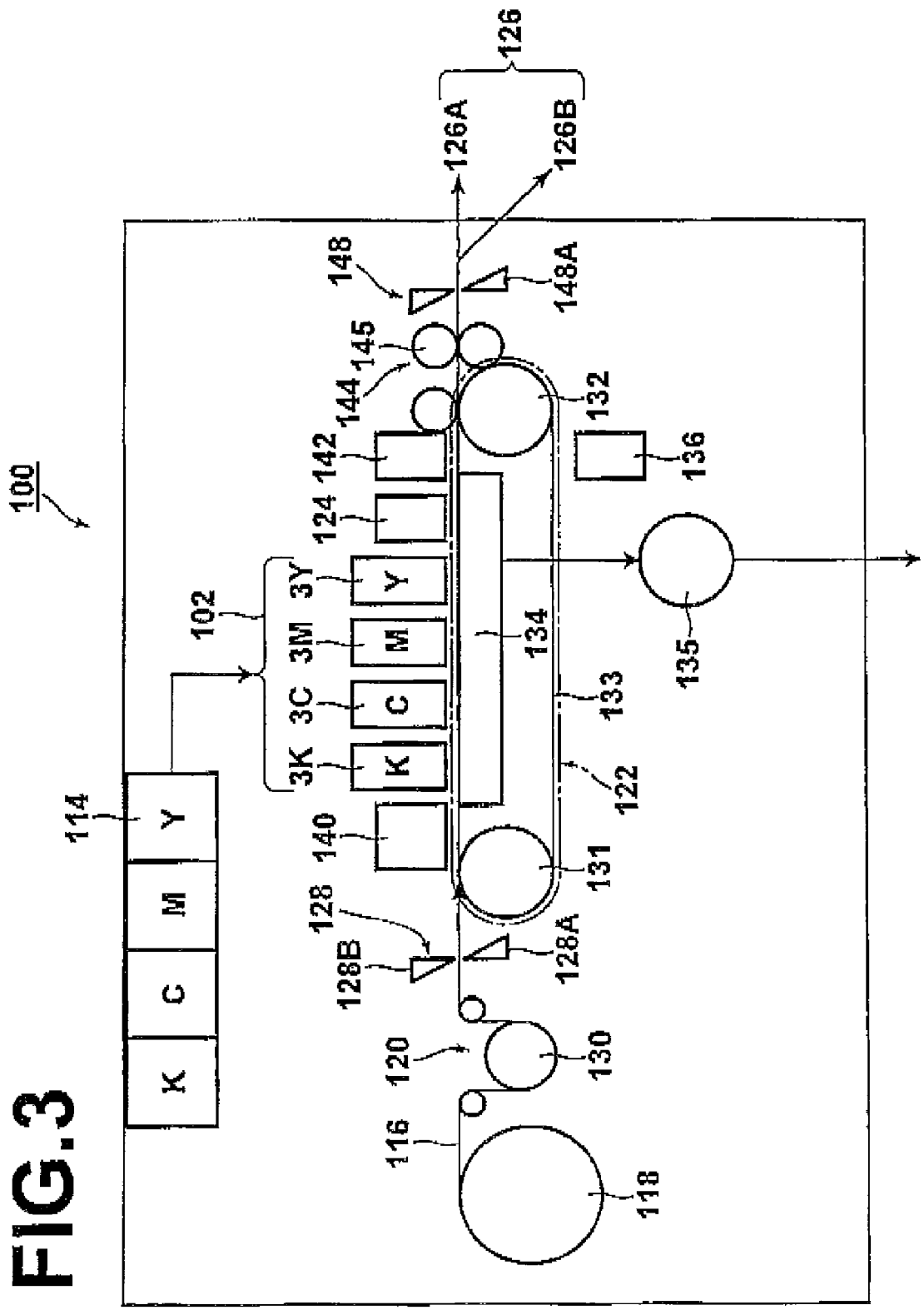
FIG. 3 is a schematic diagram of an example of an inkjet recording apparatus using the inkjet recording head of FIG. 2.
Figure 4:
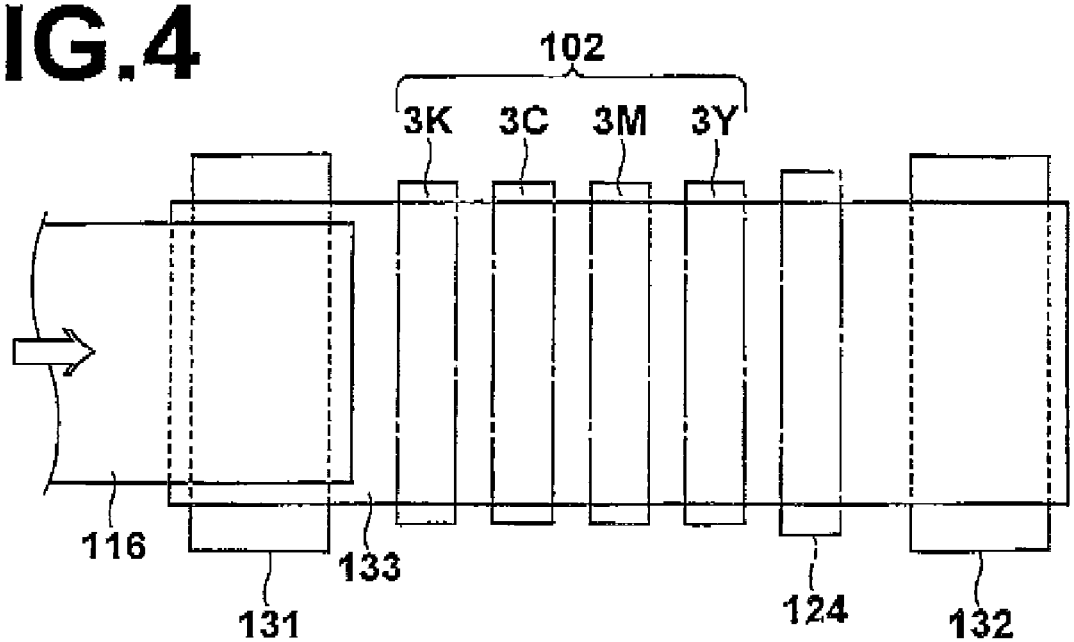
FIG. 4 is a top view of a portion of the inkjet recording apparatus of FIG. 3.

Hereinbelow, an example of an inkjet recording apparatus having the inkjet recording head 3 is explained with reference to FIGS. 3 and 4. FIG. 3 is a schematic diagram illustrating an outline of an example of an inkjet recording apparatus having the inkjet recording head 3 of FIG. 2, and FIG. 4 is a top view of a portion of the inkjet recording apparatus of FIG. 3.

As schematically illustrated in FIG. 3, the inkjet recording apparatus 100 comprises a printing unit 102, an ink reserve-and-load unit 114, a sheet feeding unit 118, a decurling unlit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head 3 according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 3. The cutter 128 is constituted by a fixed blade 128A and a round blade 1288. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor Trace of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and auctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 3, and the recording sheet 116 held on the endless belt 133 is moved from left to right in FIG. 3.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 4. Specifically, each of the heads 3K, 3C, 3M, and 3Y is a linear head in, which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 4. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink or the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises pressure rollers 145 having a surface having predetermined projections and depressions, and transfers the predetermined projections and depressions to the printed surface of the recording sheet 116 by pressing the printed surface with the pressure rollers 145 while heating the printed surface.

Finally the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Furthers in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

4. Evaluation of Concrete Example

The present inventors have produced a concrete example of a lamination of a first film 21 of a first oxide ($BiFeO_3$) and a second film 22 of a second oxide ($BiAlO_3$) in the perovskite-oxide lamination 1 according to the present invention and a comparison example of a film of an oxide ($BiAlO_3$) formed on an amorphous substrate, as indicated below.

4.1 Concrete Example

The concrete example of the present invention has been produced as follows.

Figure 5:
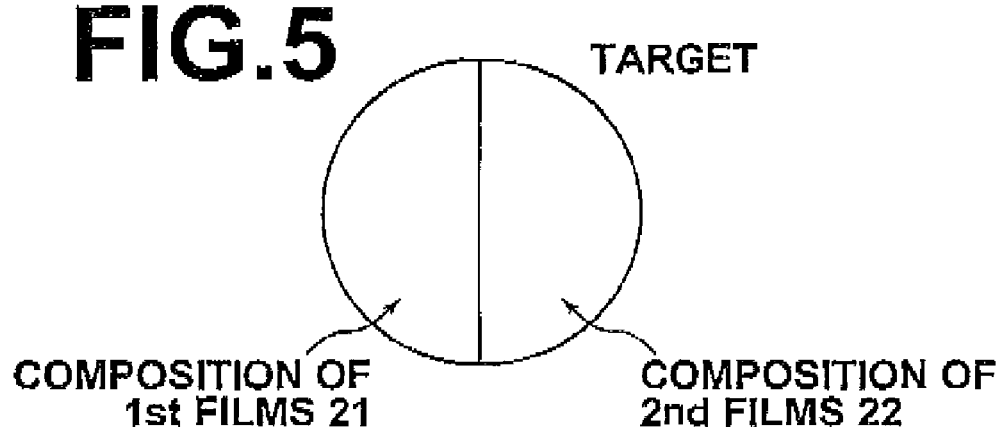
FIG. 5 is a plan view of a target used in production of a concrete example.

First, a film of $BiFeO_3$ (as the first film 21 of the first oxide) having a thickness of 50 nm has been formed on a (100) monocrystalline substrate 11 of $SrTiO_3$ by pulsed-laser deposition (PLD) under the condition that the substrate temperature is 650° C., the oxygen partial pressure is 100 mTorr, an excimer laser at the wavelength of 248 nm is used, the frequency of the laser pulse is 10 Hz, and the laser-light intensity is 200 mJ. Subsequently, a film of $BiAlO_3$ (as the second film 22 of the second oxide) having a thickness of 10 nm has been formed on the above first film 21. Specifically, the pulsed-laser deposition is performed so that the thicknesses of the first and second films 21 and 22 are controlled at the desired values by using the target which constituted as illustrated in FIG. 5, and rotating the target and the substrate at adjusted rotation speeds.

Thereafter, the crystal structure of the second film 22 of $BiAlO_3$ formed as above has been analyzed by XRD (X-ray diffraction) measurement, and formation of a perovskite crystal structure has been confirmed. In addition, the surface of the second film 22 of $BiAlO_3$ has been observed by RHEED (reflection high energy electron diffraction), and diffraction spots indicating epitaxial growth have been observed.

4.2 Comparison Example

As the comparison example, a film of $BiAlO_3$ has been formed on a glass substrate under a condition similar to the concrete example, and XRD measurement and RHEED observation of the $BiAlO_3$ film have been performed. The result of the XRD measurement indicates the existence of a crystalline phase having a crystal structure different from the perovskite crystal structure, and a halo pattern indicating a polycrystalline structure has been observed by the RHEED observation.

5. Industrial Usability

The piezoelectric device according to the present invention can be preferably used in piezoelectric actuators, and the like, where the piezoelectric actuators may be mounted in the inkjet recording heads, the magnetic recording-and-reproduction heads, MEMS (micro electromechanical systems) devices, micropumps, ultrasonic probes, and the like. In addition, the perovskite-oxide lamination according to present invention can be preferably used in ferroelectric memories (FRAMs) and the like.

What is claimed is:

1. A perovskite-oxide lamination comprising:
    a substrate; and
    one or more first films of a first oxide of a perovskite type and one or more second films of a second oxide which are alternately formed over said substrate;
    wherein said first oxide has a composition expressed as $ABO_3$, said second oxide has a composition expressed as $CDO_3$, each of A and C represents one or more A-site elements which are one or more metal elements, each of B and D represents one or more B-site elements which are one or more metal elements, O represents oxygen, said second oxide is unable to be formed to have a perovskite crystal structure at normal pressure without a thickness limitation, and said one or more first films and said one or more second films may contain inevitable impurities.

2. A perovskite-oxide lamination according to claim 1, wherein said one or more A-site elements represented by C is Bi.

3. A perovskite-oxide lamination according to claim 2, wherein said one or more B-site elements represented by D is one or more of metal elements Al, Sc, Ga.

4. A perovskite-oxide lamination according to claim 1, wherein said one or more first films and said one or more second films are epitaxial films.

5. A perovskite-oxide lamination according to claim 1, wherein said substrate is a monocrystalline substrate of silicon or an oxide.

6. A piezoelectric device comprising:
    said perovskite-oxide lamination according to claim 1; and
    electrodes formed integrally with said perovskite-oxide lamination.

7. A liquid discharge device comprising:
    said piezoelectric device according to claim 6; and
    a discharge member being formed integrally with or separately from said substrate, and including,
        a liquid-reserve chamber which reserves liquid, and
        a liquid-discharge outlet through which said liquid is externally discharged from the liquid-reserve chamber.

* * * * *